United States Patent [19]
Ozawa et al.

[11] Patent Number: 5,428,620
[45] Date of Patent: Jun. 27, 1995

[54] DATA WRITING/READING DEVICE OF CAMERA

[75] Inventors: Katsuji Ozawa; Michihiro Shiina; Fumio Iwai, all of Omiya, Japan

[73] Assignee: Fuji Photo Optical Co., Ltd., Saitama, Japan

[21] Appl. No.: 878,456

[22] Filed: May 5, 1992

[30] Foreign Application Priority Data

May 9, 1991 [JP] Japan ................................. 3-133615
May 14, 1991 [JP] Japan ................................. 3-138323

[51] Int. Cl.$^6$ ........................................... G11C 29/00
[52] U.S. Cl. .................................. 371/212; 371/21.1; 371/21.6
[58] Field of Search .............. 395/578; 371/21.2, 21.4, 371/21.6, 21.3, 13, 66

[56] References Cited

U.S. PATENT DOCUMENTS

| | | | |
|---|---|---|---|
| 4,811,294 | 3/1989 | Kobayashi et al. | 371/21.2 |
| 5,233,614 | 8/1993 | Singh | 371/21.1 |
| 5,255,227 | 10/1993 | Haeffele | 371/21.1 |

*Primary Examiner*—Vincent P. Canney

[57] ABSTRACT

A data writing/reading device of a camera, in case it has become impossible to write data correctly to certain memory area of an E$^2$PROM because of frequent re-writings, can write data to other memory areas of the E$^2$PROM, and read out the data. Write requiring data to the E$^2$PROM is written to a first predetermined address of the E$^2$PROM, and read out immediately after writing. If the write requiring data and the read data are non-coincident, an address which is different from the preceding address is designated, and writing and reading are repeated until the write requiring data and read data become coincident. When the write requiring data and the read data agree with each other, writing to the E$^2$PROM is finished. And, an address on which data which agrees with the write requiring data is written, as data, to a second predetermined address of the E$^2$-PROM which does not overlap with addresses used for writing write requiring data. In reading, the address on which the data which agrees with the write requiring data is written is read out from the second predetermined address, and the data is read out from the E$^2$-PROM based on the read address.

8 Claims, 12 Drawing Sheets

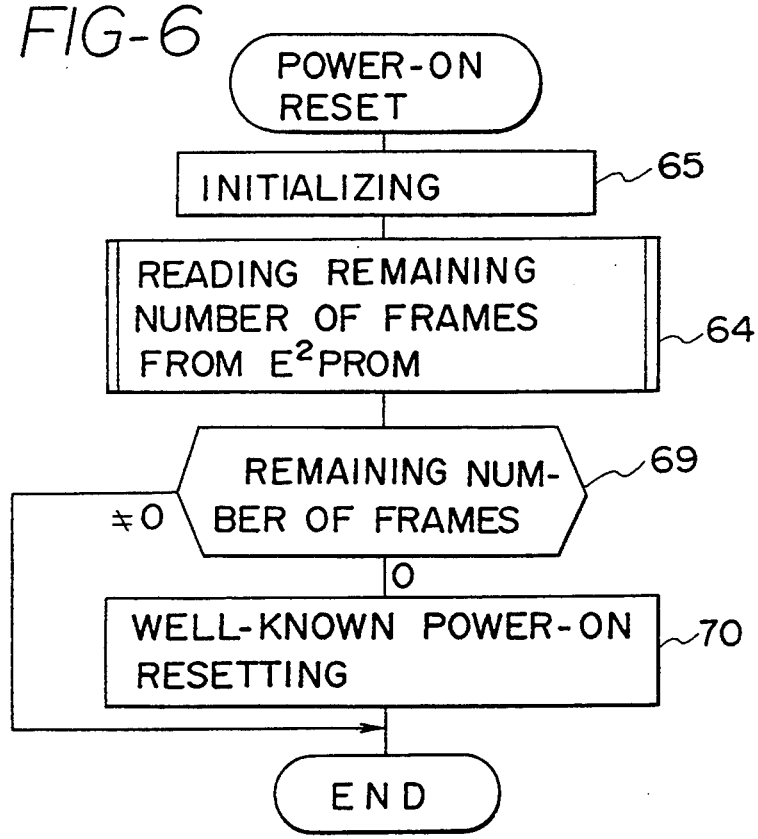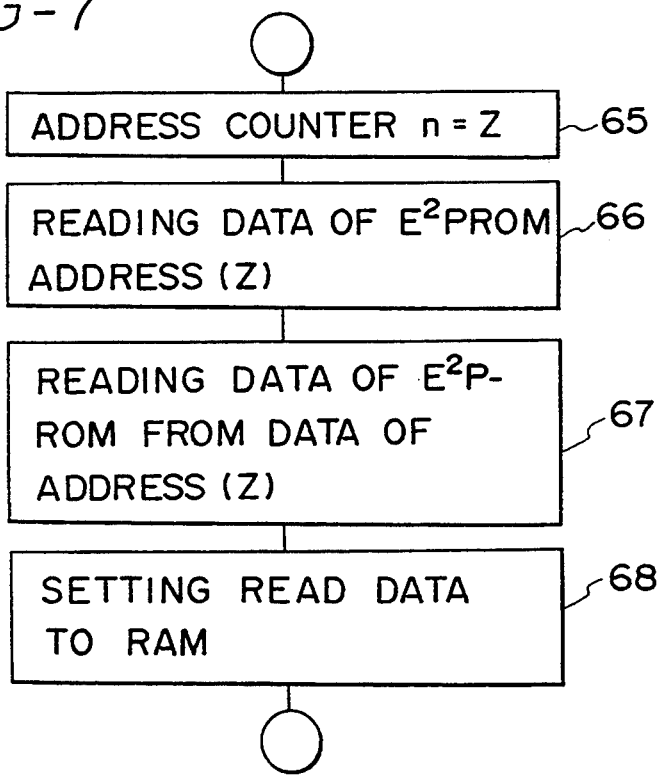

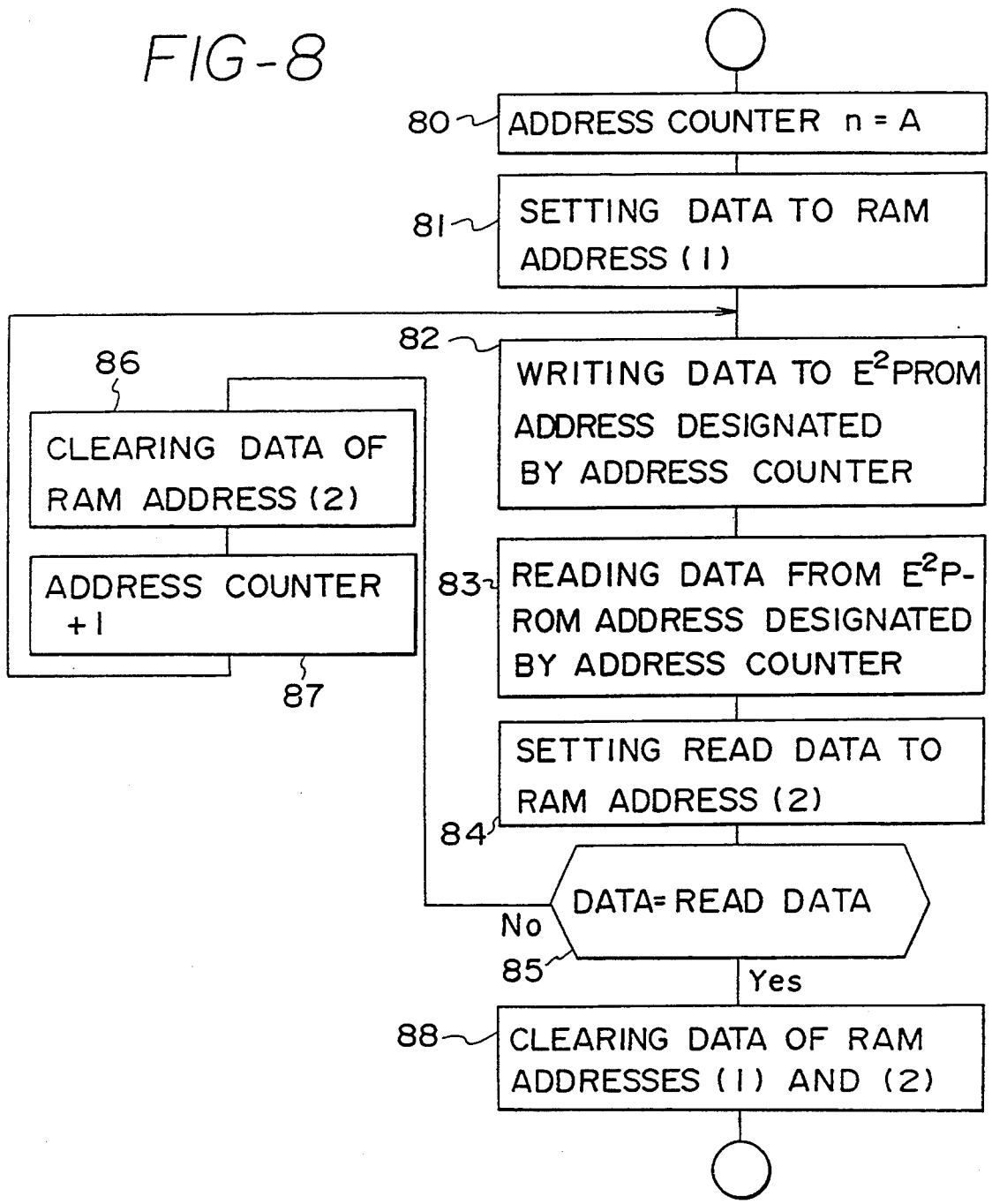

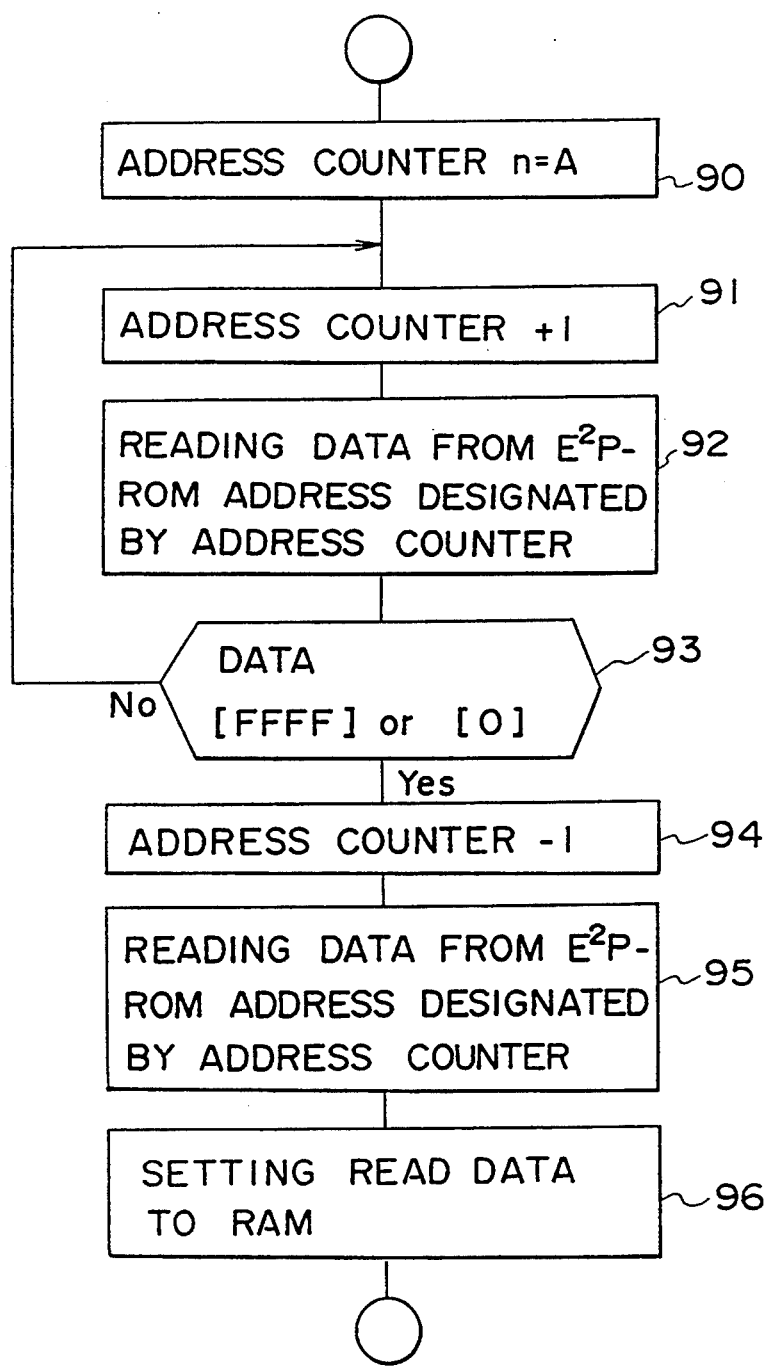

DATA WRITING/READING DEVICE OF CAMERA

BACKGROUND OF THE INVENTION

The present invention relates to a data writing/reading device of a camera, in particular, relates to a data writing/reading device for writing data to a non-volatile memory $E^2PROM$ (Electronic Erasable and Programmable ROM) and reading data from the $E^2PROM$.

In some cameras of the present, an electrically rewritable non-volatile memory $E^2PROM$ are used for the purpose of storing data such as the number of frames of a film in case a power source is used up, such as exhaustion of a battery. When an $E^2PROM$ is used, generally a method which fixes an address for the data to always use the same memory area is applied. When rewriting of data is conducted in the same memory area of a fixed address, since there is a limit in the number in rewritings of one memory area of an $E^2PROM$, there is a fear that correct writing of data might become impossible after frequent rewritings of data. Also, even within the limit of the number of rewritings, there is a fear that correct writing of data in the memory area might become impossible due to certain anomaly. If such a condition is caused, it is not possible to obtain correct data even if a fresh battery is loaded to a camera, and it would result in a serious hindrance to a systematic operation of the camera.

In an ordinary camera, a backup capacitor is provided for backing up a power source only for a short time in case a battery is removed or exhausted. In case of a camera like this, when the battery is removed or exhausted in the midst of writing data to an $E^2PROM$, the power source is backed up by the backup capacitor and the writing of data to the $E^2PROM$ is continued. However, as a writing current of the $E^2PROM$ is as large as 2 mA, there is a fear that it might not possible to back up the power source during the writing to the $E^2PROM$ and the writing of data might not be finished completely. If a writing to the $E^2PROM$ is caused during a backup of the power is being supplied by the backup capacitor, writing errors of data occurs very often. That is, there is a fear that errors might occur in writing of data to the $E^2PROM$. If such a condition is caused, it is not possible to obtain correct data even when the battery is loaded to a camera, and it would also result in a serious hindrance to a systematic operation of the camera.

SUMMARY OF THE INVENTION

It is an object of the present invention to provide an improved data writing/reading device of a camera.

Another object of the present invention is to provide a data writing/reading device of a camera which can write correct data to an $E^2PROM$ and read the data, even if exact writing of data to a memory area of the $E^2PROM$ has become impossible because of the reasons including frequent rewritings.

Still another object of the present invention is to provide a data writing/reading device of a camera which can prevent writing errors to an $E^2PROM$ derived from a lack of writing voltage.

The above and other objects are attained by a data writing/reading device of a camera comprising; an electrically rewritable non-volatile memory $E^2PROM$; writing/reading means for inputting write requiring data to said $E^2PROM$, writing said write requiring data to a first predetermined address of said $E^2PROM$, and for reading data which is written in said first predetermined address after finishing the writing; judging means, responsive to said write requiring data and the data read out by said writing/reading means, for judging coincidence/non-coincidence between said write requiring data and the data read out by said writing/reading means; controlling means responsive to judgment results of said judging means, said controlling means, in case said write requiring data and the data read out by said writing/reading means are non-coincident, designating to said writing/reading means another address which is different from the preceding address, and driving said writing/reading means so that said writing/reading means repeats writing and reading until said write requiring data and the data read out from said $E^2PROM$ coincide with each other, and said controlling means, in case said write requiring data and the data read out by said writing/reading means are coincident, finishing the writing of said write requiring data to said $E^2PROM$, and giving an address of said $E^2PROM$ on which the data which agrees with said write requiring data is written; address writing means for receiving the address of said $E^2PROM$ on which the data which agrees with said write requiring data is written, said address writing means writing an address of said $E^2PROM$ on which the data which agrees with said write requiring data is written, as data, to a second predetermined address of said $E^2PROM$ which does not overlap with addresses used for writing said write requiring data; and reading means, responsive to a read request, for reading the address of said $E^2PROM$ on which the data which agrees with said write requiring data is written from said second predetermined address, and reading the data which agrees with said write requiring data from said $E^2PROM$ based on the read address.

Also, the above and other objects are attained by a data writing/reading device of a camera comprising; an electrically rewritable non-volatile memory $E^2PROM$; writing/reading means for inputting write requiring data to said $E^2PROM$, writing said write requiring data to a predetermined address of said $E^2PROM$, and for reading data which is written in said predetermined address after finishing the writing; judging means, responsive to said write requiring data and data read out by said writing/reading means, for judging coincidence/incoincidence between said write requiring data and data read out by said writing/reading means; controlling means responsive to judgment results of said judging means, said controlling means, in case said write requiring data and the data read out by said writing/reading means are incoincident, designating to said writing/reading means different addresses which follow said predetermined address in order, and driving said writing/reading means so that said writing/reading means repeats writing and reading until said write requiring data and the data read out from said $E^2PROM$ coincide with each other, and said controlling means, in case said write requiring data and the data read out by said writing/reading means are coincident, finishing the writing of said write requiring data to said $E^2PROM$; and reading means, responsive to a read request, for reading data of addresses which follow said predetermined address in order, and for reading, when an address on which no data is written is reached, the data which agree with said write requiring data from said $E^2PROM$ based on an address which is one before the address on which no data is written.

Further, the above and other objects are attained by adding an undermentioned composition to the above-mentioned data writing/reading device. The composition comprises a backup capacitor for backing up a power source for a short time in case a battery of said camera is withdrawn or worn out; a voltage detecting means for detecting whether a voltage of said backup capacitor is equal to or above a predetermined voltage; and means, responsive to said voltage detecting means, for permitting writing to said $E^2PROM$ in case the voltage of said backup capacitor is equal to or above said predetermined voltage, and for inhibiting writing to said $E^2PROM$ in case the voltage of said backup capacitor is below said predetermined voltage, and said writing/reading means conducts writing when writing to said $E^2PROM$ is permitted and does not conduct writing when writing to said $E^2PROM$ is inhibited.

BRIEF DESCRIPTION OF THE DRAWINGS

The foregoing objects, features and attendant advantages of the present invention will be appreciated as the same become better understood by means of the following description and accompanying drawings wherein;

FIG. 6 is a flow diagram of the microcomputer of FIG. 3, showing a processing of power-on reset which is executed when the battery is loaded after the time the power source is backed up is passed;

FIG. 7 is a flow diagram of the microcomputer of FIG. 3, showing a read processing of a step 64 of FIG. 6;

FIG. 8 is a flow diagram of the microcomputer of FIG. 3, showing a control case different from the case of FIG. 5, and showing write processings of steps 42 and 62 of FIG. 4;

FIG. 9 is a flow diagram of the microcomputer of FIG. 3, showing a control case different from the case of FIG. 7, and showing the read processing of the step 64 of FIG. 6;

DETAILED DESCRIPTION OF THE INVENTION

Figure 1:
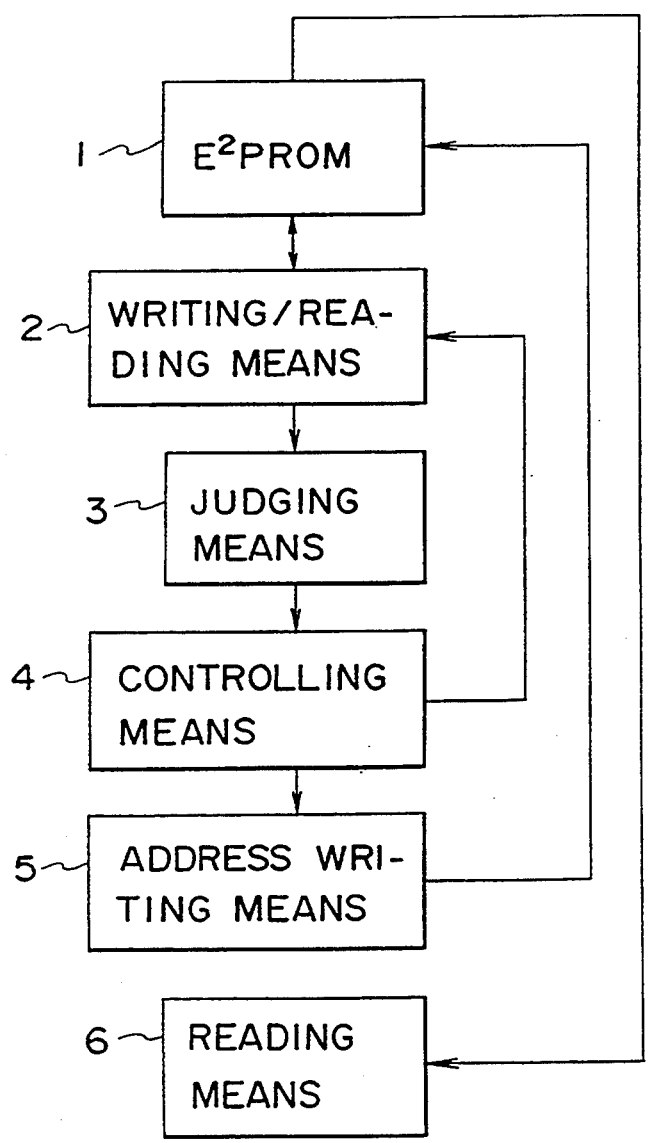
FIG. 1 is a block diagram showing a first fundamental embodiment of a data writing/reading device of a camera according to the present invention.

In a first fundamental embodiment of FIG. 1, a reference numeral 1 is an electrically rewritable non-volatile memory $E^2PROM$. Writing/reading means 2 input write requiring data to an $E^2PROM$ 1, and write the data to a first predetermined address of the $E^2PROM$ 1 and give the data to judging means 3. Further, the writing/reading means 2, after the writing of the data is finished, read the data written to the first predetermined address immediately, and give the read data to the judging means 3. The judging means 3 judge coincidence/incoincidence between the write requiring data and the read data, and give the result of judgment to controlling means 4. The controlling means 4, in case the write requiring data and the read data are incoincident, recognize as the address to which the write requiring data is written is broken, and performs the following controls. First, the controlling means 4 designates to the writing/reading means 2, addresses which are different from the preceding address, and drives the writing/reading means 2 so that the writing/reading means 2 repeats writing and reading until the write requiring data and data read out from the $E^2PROM$ 1 agree with each other. Next, the controlling means 4, when the write requiring data and the read data become coincident, recognizes that the write requiring data is correctly stored, stops driving the writing/reading means 2, and finishes the writing of data to the $E^2PROM$ 1. After that, the controlling means 4 gives address writing means 5 an address of the $E^2PROM$ 1 to which data which agrees with the write requiring data is written. On the other hand, when the write requiring data and the read data are coincident, writing to the $E^2PROM$ 1 is finished, without performing the control of the writing/reading means 2, and the address writing means 5 is given an address of the $E^2PROM$ 1 to which the data which agrees with the write requiring data is written. The address writing means 5 writes the address of the $E^2PROM$ 1 of which the data which agrees with the write requiring data is written, as data, to a second predetermined address of the $E^2PROM$ 1 which does not overlap with addresses used for writing the write requiring data. When reading, reading means 6, responsive to a reads request, read the address of the $E^2PROM$ 1 to which the data which agrees with the write requiring data from the second predetermined address, and reads the data from the $E^2PROM$ 1 based on the read address. According to a composition like this, in case it has become impossible to write data correctly to a memory area of the $E^2PROM$ 1 because of frequent rewritings, for example, correct data is written to another memory area of the $E^2PROM$ 1, and the correct data can be read out.

Figure 2:
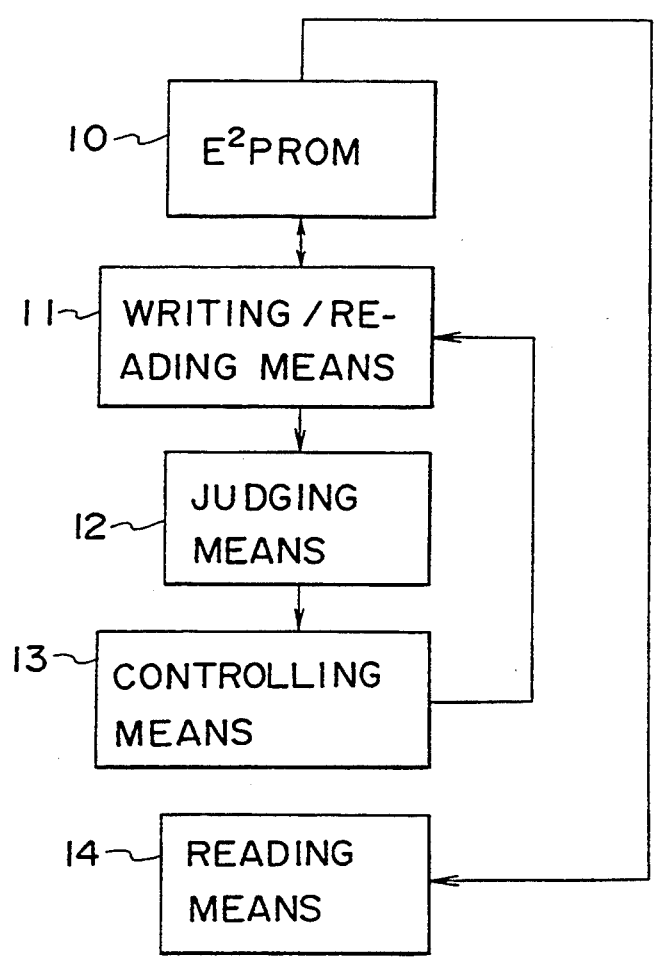
FIG. 2 is a block diagram showing a second fundamental embodiment of a data writing/reading device of a camera according to the present invention.

In the second fundamental embodiment of FIG. 2, a reference numeral 10 is an electrically rewritable non-volatile memory $E^2PROM$. Writing/reading means 11 inputs write requiring written data to the $E^2PROM$ 10, and writes this written data to a predetermined address of the $E^2PROM$ 10, and gives the data to judging means 12. Further, the writing/reading means 11, after the writing of written data is completed, reads out the written data which is written to the predetermined address immediately, and the read data to the judging means 12. The judging means 12, judges coincidence/non-coincidence between the written data and the read data, and gives the result of judgment to controlling means 13. The controlling means 13, in case the written data and the read data are non-coincident, recognizes that as the address to which the written data is written is broken, and perform the following controls. First, the controlling means 13 designates to the writing/reading means 11 different addresses which follow the predetermined address in order, and thereby control the writing/reading means 11 so that the writing/reading means 11 repeats writing and reading until the written data and data read out from the E$^2$PROM 10 agree with each other. Next, the controlling means 13, when the written data and the read data become coincident, recognizes that the written data is correctly stored, stops driving the writing/reading means 11, and finishes the writing of data to the E$^2$PROM 10. On the other hand, when the written data and the read data are coincident, the controlling means 13 finishes writing to the E$^2$PROM 10, without performing the control of the writing/reading means 11. In reading, reading means 14, responsive to a reads request, read data from the E$^2$PROM 10 as follows. The reading means 14 reads data of each address which follows the predetermined address in order. The reading means, when an address on which data is not written is reached, recognizes that data is stored at an address one before the address, and reads the data from the E$^2$PROM 10 based on the address one before the address on which data is not written. According to a composition like this, when it has become impossible to write data correctly to a memory area of the E$^2$PROM 10 because of frequent rewritings, for example, correct data is written to another memory area of the E$^2$PROM 10, and the data is read out.

The contents of the foregoing first and second fundamental embodiments will be better understood by means of the first preferred embodiment undermentioned with regard to FIG. 3–FIG. 9.

Figure 3:
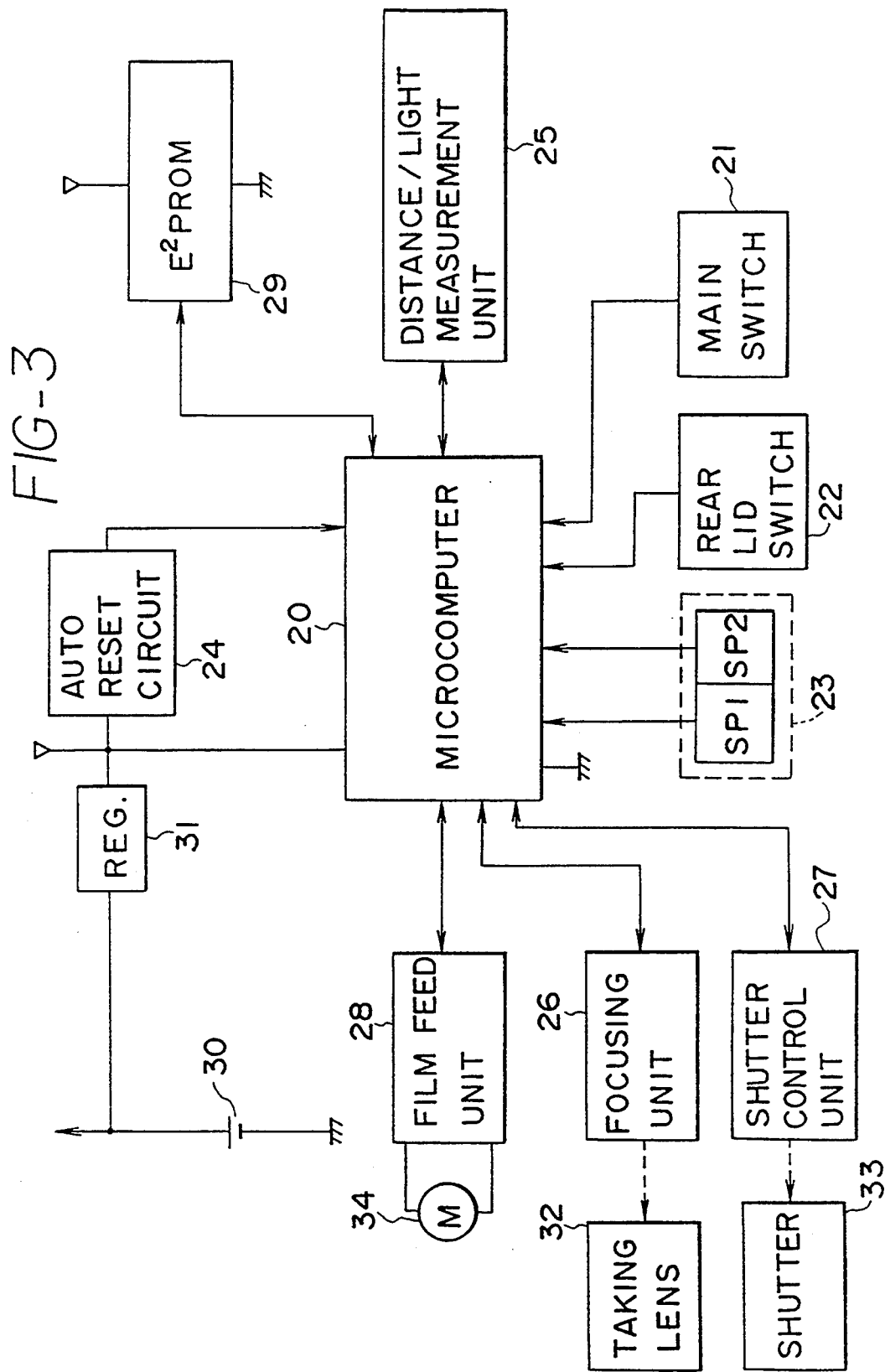
FIG. 3 is a block diagram showing a first preferred embodiment of a data writing/reading device of a camera according to the present invention.

In the first preferred embodiment of FIG. 3, a reference numeral 20 is a microcomputer. The microcomputer 20 receives on/off signals from a main switch 21, on/off signals from a rear lid switch, a start signal and a release signal from a release switch 23, and a reset signal from an auto reset circuit 24. The microcomputer 20 controls a distance/light measurement unit 25, a focusing unit 26, a shutter control unit 27 and a film feed unit 28, and writing/reading of an electrically rewritable non-volatile memory E$^2$PROM 29. A reference numeral 30 is a battery of a camera. The battery 30 supplies a power source to the focusing unit 26, the shutter control unit 27 and the film feed unit 28, and via a regulator 31 supplies a power source to the microcomputer 20 and the E$^2$PROM 29.

The main switch 21 is interlocked with the opening and closing of a lens barrier, which is a cover of a taking lens 32. The main switch 21 gives an on signal to the microcomputer 20 when the lens barrier is opened. The rear lid switch 22 is interlocked with the opening and closing of a rear lid of the camera. The rear lid switch 22 gives an on signal to the microcomputer 20 when the rear lid of the camera is closed. The release switch 23 is a two-step push button switch composed of a first-step switch SP1 and a second-step switch SP2. The release switch 23, when the first-step switch SP1 is made on, gives the microcomputer 20 a start signal for starting a distance measurement and a light measurement, and when the second-step switch SP2 is made on, gives the microcomputer 20 a release signal for starting an exposure. The auto reset circuit 24 is connected via the regulator 31 to the battery 30, and gives the microcomputer 20 a reset signal when the battery 30 is loaded. As already known well, the microcomputer 20, when the battery 30 is removed, is backed up by a backup capacitor (not shown in the drawing) for the power source only and for a short time. If the battery 30 is loaded within a time the power source is backed up, the auto reset circuit 24 does not give the reset signal.

The distance/light measurement unit 25 performs a distance measurement and a light measurement under a control of the microcomputer 20, and gives distance measurement information and light measurement information to the microcomputer 20. The focusing unit 26, controlled by the microcomputer 20, delivers the taking lens 32 to a focus position, and returns the taking lens to a home position. The shutter control unit. 27, controlled by the microcomputer 20, opens and closes the shutter 33. The film feed unit 28, controlled by the microcomputer 20, drives a film feed motor 34 for a forward rotation and a reverse rotation.

The microcomputer 20 has functions for performing automatic focusing, automatic exposure, pre-winding of a film and single frame winding of the film. Further, the microcomputer 20 has functions for writing an available number of frames in the film to the E$^2$PROM 29, and for reading the remaining number of frames from the E$^2$PROM 29 following an undermentioned flow diagram.

Figure 4:
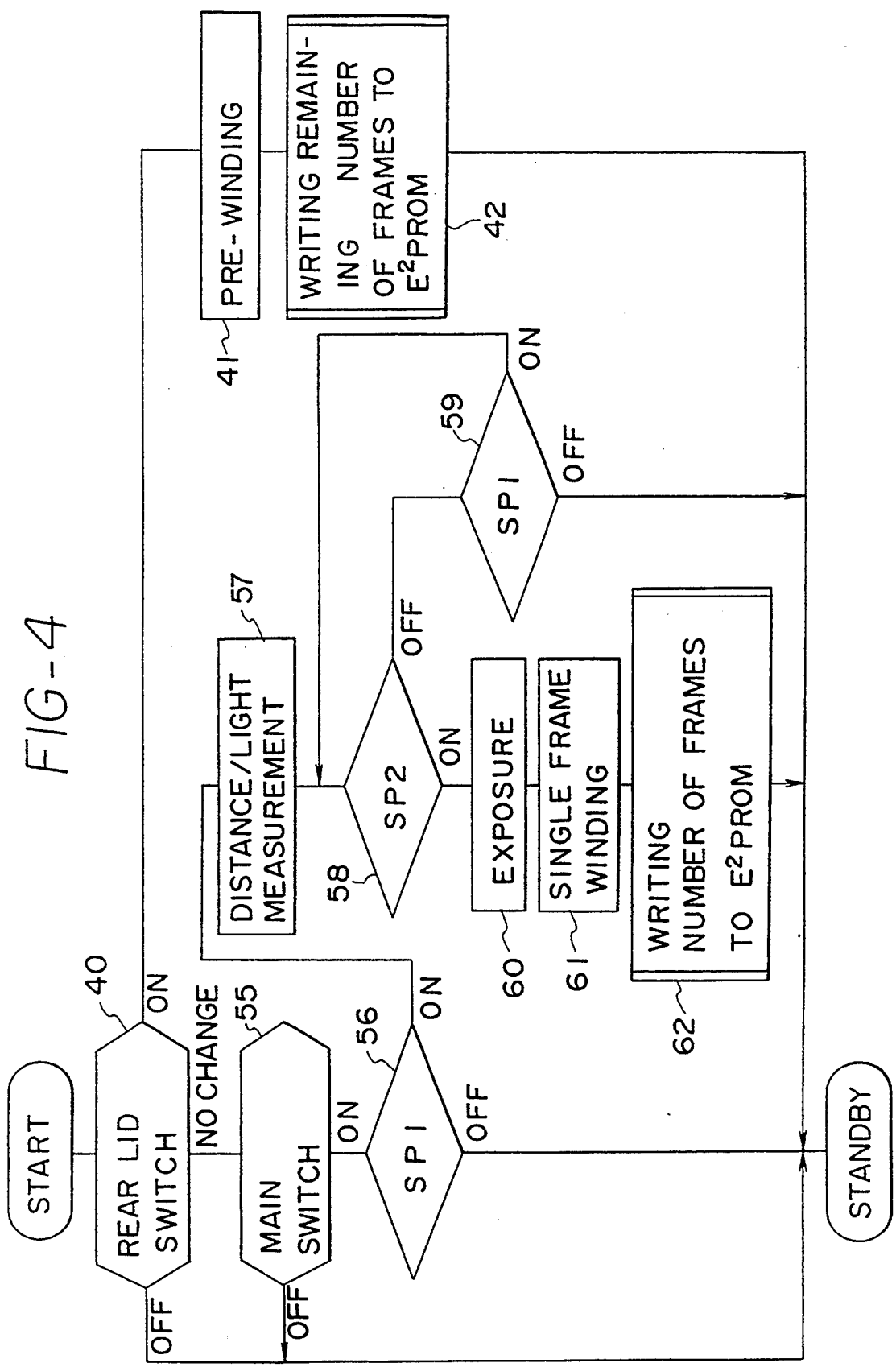
FIG. 4 is a flow diagram of a microcomputer of FIG. 3, showing processings executed by switch operations or when a battery is loaded within a time a power source is backed up.
Figure 5:
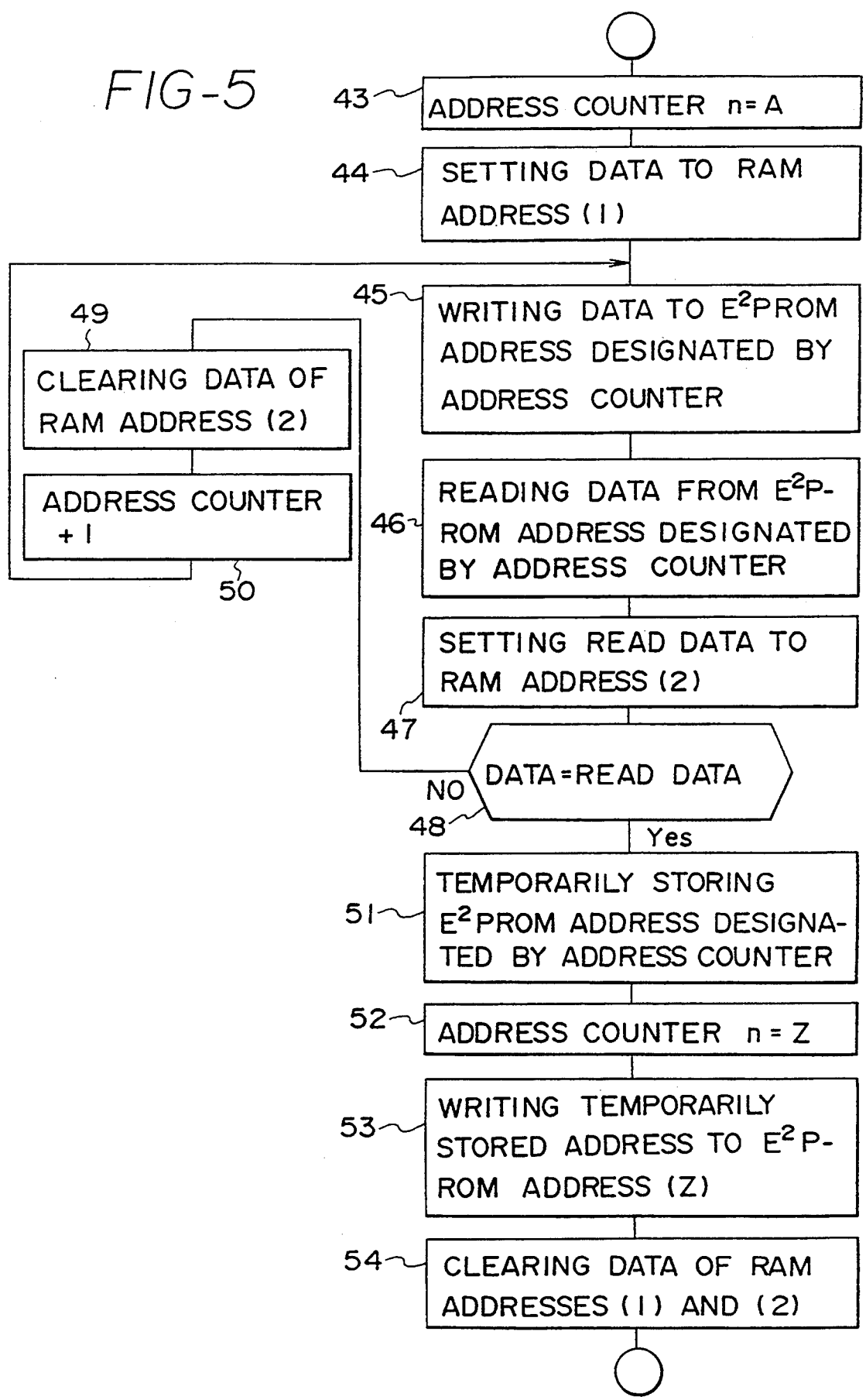
FIG. 5 is a flow diagram of the microcomputer of FIG. 3, showing write processings of steps 42 and 62 in FIG. 4.

FIG. 4, FIG. 5, FIG. 6 and FIG. 7 are flow diagrams of the microcomputer 20 of FIG. 3. FIG. 4 shows processings executed by switch operations or when the battery 30 is loaded within a time the power source is backed up. FIG. 5 shows write processings of steps 42 and 62 of FIG. 4. FIG. 6 shows a processing of power-on reset executed when the battery is loaded after the time the power source is backed up is passed. FIG. 7 shows a read processing of a step 64 of FIG. 6.

When the rear lid of the camera in which the film is loaded is closed, the rear lid switch 22 gives an on signal to the microcomputer 20. By this, the microcomputer 20 starts controls of FIG. 4. The microcomputer 20 enter a step 41 through a status judgment of the rear lid switch 22 of a step 40. The microcomputer 20 pre-winds the film at the step 41, and writes an available number of frames of the film to the E$^2$PROM 29 at the step 42, and goes to a standby status after these processings. In the pre-winding of the film, first, the film in a cartridge is wound up to a spool by a forward rotation of the film feed motor 34. The microcomputer 20 counts the remaining number of frames of the film wound up to the spool, and recognizes the remaining number of frames of the loaded film. Next, after the film is completely wound up to the spool, a first frame; setting is performed. That is, in order to set a first frame, the film is unwound by a prescribed length to the cartridge by a reverse rotation of the film feed motor 34. In the step 42, following the flow diagram of FIG. 5, the remaining number of the loaded film is written to the E$^2$PROM 29.

In FIG. 5, the microcomputer 20 sets a first predetermined address (A) to an address counter of the E$^2$PROM 29 at a step 43, and enters a step 44. At the step 44, the microcomputer 20 sets write requiring data to an address (1) of a RAM, and enters a step 45. In this embodiment, the write requiring data is the remaining number of frames of the film. The address counter and the RAM of the E²PROM 29 are built in the microcomputer 20. The microcomputer 20 at the step 45 writes the write requiring data to and address of the E²PROM 29 designated by the address counter, and enters a step 46. At the step 46, the microcomputer 20 reads data from an address of the E²PROM 29 designated by the address counter, and enters a step 47. At the step 47, the microcomputer 20 sets the data which was read out at the step 47 to an address (2) of the RAM, and enters a step 48. At the step 48, the microcomputer 20 judges coincidence/non-coincidence between the data which was set to the address (1) of the RAM at the step 44 and the data which was set to the address (2) of the RAM at the step 47. If both data are non-coincident, the microcomputer 20 recognizes that the address of the E²PROM 29 which was used for writing data is broken, and goes to a step 49. At the step 49, the microcomputer 20 clears the data set at the address (2) of the RAM, and enters a step 50. At the step 50, the microcomputer 20 increments the address counter of the E²PROM 29 by +1, and returns to the step 45. The microcomputer 20, when the data which is set at the address (1) of the RAM and the data which is set at the address (2) of the RAM are coincident, goes to a step 51. At the step 51, the microcomputer 20 memorizes the address of the E²PROM 29 at which the data which agrees with the data set at the address (1) of the RAM temporarily, and enters a step 52. At the step 52, the microcomputer 20 sets a second predetermined address (Z) of the E²PROM 29 which does not overlap with addresses used for writing data to the address counter of the E²PROM 29, and enters a step 53. At the step 53, the microcomputer 20 writes the address which is memorized temporarily at the step 51, as data, to the second predetermined address (Z), and enters a step 54. At the step 54, the microcomputer 20 clears the data of addresses (1) and (2) of the RAM, and finishes the writing of the data, that is, the remaining number of frames to the E²PROM 29.

In FIG. 4, when the main switch 21 is turned on, the microcomputer 20 goes through steps 40 and 55 to the step 56. If the rear lid switch 22 is left on and does not change if the rear lid of the camera is left closed, the microcomputer 20 enters an on/off judgment of the main switch 21 of a step 55 from the status judgment of the rear lid switch 22 at the step 40. At the step 56, the microcomputer 20 goes to the standby status if the first-step switch SP1 of the release switch 23 is off, and enters a release processing if the first-step switch SP1 is on. In the release processing, distance measurement information and light measurement information are taken in by driving distance/light measurement unit 25 at a step 57, and an on/off judgment of the second-step switch SP2 of the release switch 23 is conducted at a step 58. If the second-step switch is off, the microcomputer 20 enters the on/off judgment of the first-step switch SP1 of the step 59, and if the second-step switch SP2 is on, enters an exposure processing of a step 60. In the on/off judgment of the first-step switch SP1 of the step 59, the microcomputer 20 returns to the step 58 if the first-step switch SP1 is on, and goes to the standby status if the first-step switch SP1 is off. In the exposure processing of the step 60, the taking lens 32 is delivered to a focus position which corresponds to distance measurement information by controlling the focusing unit 26, and the shutter 33 is opened or closed according to light information by controlling the focusing unit 27, and the taking lens 32 is returned to the home position by controlling the focusing unit 27. The microcomputer 20 enters a step 61 after the exposure processing is finished, performs a single-frame winding of the film by controlling the film feed unit 28, and decrements the remaining number of frames of the film by −1, and enters a step 62. At the step 62, the microcomputer 20 writes the current remaining number of frames to the E²PROM 29 following the flow diagram of FIG. 5, and goes to the standby status after the writing is finished.

If the battery 30 is removed or exhausted and the battery 30 is loaded after the time the power source is backed up is passed, a reset signal is given from the auto reset circuit 24 to the microcomputer 20. By this, the microcomputer 20 starts a power-on reset of FIG. 6. The microcomputer 20 enters a step 64 through an initialization of a step 63. At the step 64, the microcomputer 20 reads the remaining number of frames of the film from the E²PROM 29 following the flow diagram of FIG. 7.

In FIG. 7, the microcomputer 20 sets the second predetermined address (Z) to the address counter of the E²PROM 29 at a step 65, and enters a step 66. At the step 66, the microcomputer 20 reads an address stored on the second predetermined address (Z) of the E²PROM 29, and enters a step 67. At the step 67, the microcomputer 20 reads data of the E²PROM 29 based on the read address. By this, the remaining number of frames of the film in case the battery 30 is removed or exhausted is obtained. At a step 68, the microcomputer 20 sets the read remaining number of frames of the film to the RAM.

Returning to FIG. 6, the microcomputer 20 reads the remaining number of frames from the E²PROM 29, and enters a step 69. At the step 69, the microcomputer 20 performs a judgment whether or not the remaining number of frames is zero. If the remaining number of frames is zero, the microcomputer 20 performs the well-known power-on reset at a step 70, including a display of power-on reset, a wind processing of film for winding the film up to the cartridge, etc., and finishes the power-on reset. If the remaining number of frames is not zero, the microcomputer 20 finishes the power-on reset, without performing the processings of the step 70.

In FIG. 4, when the rear lid of the camera is opened and the rear lid switch 22 is turned off, the microcomputer 20 goes from the step 40 and through the well-known rear lid open processing (not shown in the drawing) to the standby status. When the main switch 21 is turned off, the microcomputer 20 goes from the step 55 and through the well-known main switch off processing (not shown in the drawing) to the standby status.

According to a composition like this, the remaining number of frames of the film is written to the first predetermined address (A) of the E²PROM 29 and read out from the E²PROM 29 immediately after the writing. If the write requiring remaining number of frames and the read data are non-coincident, an address which is different from the preceding address is designated, and thus writing and reading is repeated until both coincide with each other. When both become coincident, writing to the E²PROM 29 is finished, and an address of the E²PROM 29 on which data which agrees with the write requiring remaining number of frames is written, as data, to the second predetermined address (Z) which does not overlap with addresses used for writing the remaining number of frames. The remaining number of frames is read out from the E²PROM 29 based on the address stored on the second predetermined address (Z). Because of this, the remaining number of frames is written to the E²PROM 29 correctly and the data is read out even in case it has become not possible to write the remaining number of frames correctly to the memory area of the E²PROM 29 because of frequent rewritings.

FIG. 8 is a flow diagram of the microcomputer 20 showing a control different from that of FIG. 5, and showing the write processings of steps 42 and 62 of FIG. 4. FIG. 9 is a flow diagram of the microcomputer 20 of FIG. 3 showing a control different from that of FIG. 7, and showing the read processing of the step 64 of FIG. 6. FIG. 8 and FIG. 9 are applied as substitute for FIG. 5 and FIG. 7.

In the present embodiment, addresses of the E²PROM 29, including the predetermined address (A) which is used for writing the remaining number of frames of the film, are on a precondition that these addresses do not have any data, that is, these addresses are each at a status of [FFFF] or [0].

In FIG. 8, the microcomputer sets the predetermined address (A) to the address counter of the E²PROM 29 at a step 80, and sets the write requiring data to the address (1) of the RAM at a step 81, and enters a step 82. In the present embodiment, the write requiring data is the remaining number of frames of the film. At the step 82, the microcomputer 20 writes the write requiring data to an address of the E²PROM 29 which is designated by the address counter, and enters a step 83. At the step 83, the microcomputer 20 reads out data from the address of the E²PROM 29 which is designated by the address counter, and enters a step 84. At the step 84, the microcomputer 20 sets the read data to the address (2) of the RAM, and enters a step 85. Entering the step 85, the microcomputer 20 judges coincidence/non-coincidence between the data which was set to the address (1) of the RAM at the step 81 and the data which was set to the address (2) of the RAM at the step 84. If both are non-coincident, the microcomputer recognizes that the address of the E²PROM 29 which is used for writing the data is broken, and goes to a step 86. At the step 86, the microcomputer 20 clears the data set at the address (2) of the RAM, and enters a step 87. At the step 87, the microcomputer 20 increments the address counter of the E²PROM 29 by +1, and returns to the step 82. When the data which is set at the address (1) of the RAM and the data which is set at the address (2) of the RAM become coincident, the microcomputer 20 enters from the step 85 to a step 88. At the step. 88, the microcomputer 20 clears the data of addresses (1) and (2) of the RAM, and finishes the writing of data, that is, the writing of the remaining number of frames to the to the E²PROM 29.

In FIG. 9, the microcomputer 20 sets the predetermined address (A) to the address counter of the E²PROM 29 at a step 90, and enters a step 91. At the step 91, the microcomputer 20 increments the address counter by +1, and enters a step 92. At the step 92, the microcomputer 20 reads out data from an address of the E²PROM 29 which is designated by the address counter, and enters a step 93. At the step 93, the microcomputer 20 judges whether the read data is [FFFF] or [0], that is, whether or not any data is written. If the data of the address designated by the address counter is not [FFFF] nor [0] and any data is written on the address, the microcomputer 20 returns from the step 93 to the step 91. If the data of the address designated by the address counter is [FFFF] or [0] and no data is written on the address, the microcomputer 20 enters from the step 93 to a step 94. At the step 94, the microcomputer 20 decrements the address counter by −1, and enters a step 95. At the step 95, the microcomputer 20 reads data from an address of the E²PROM 29 which is designated by the address counter. By this, the picturable number of frames of the film in case the battery 30 is withdrawn or exhausted can be obtained. At a step 96, the microcomputer 20 sets the read picturable number of frames of the film to the RAM.

According to a composition like this, the picturable number of frames of the film is written to the predetermined address (A) of the E²PROM 29, and read out from the E²PROM 29 immediately after the writing. If the write requiring picturable number of frames and the read data are incoincident, a different address which follows the predetermined address (A) is designated in order, and thus writing and reading is repeated until both coincide with each other. When both become coincident, writing to the E²PROM 29 is finished. The picturable number of frames is read out from the E²PROM 29 as follows. Data of each address which follows the predetermined address (A) is read out in order. When an address on which no data is written, reading is stopped. An address one before the address on which no data is written is designated, and the remaining number of frames is read out.

Figure 10:
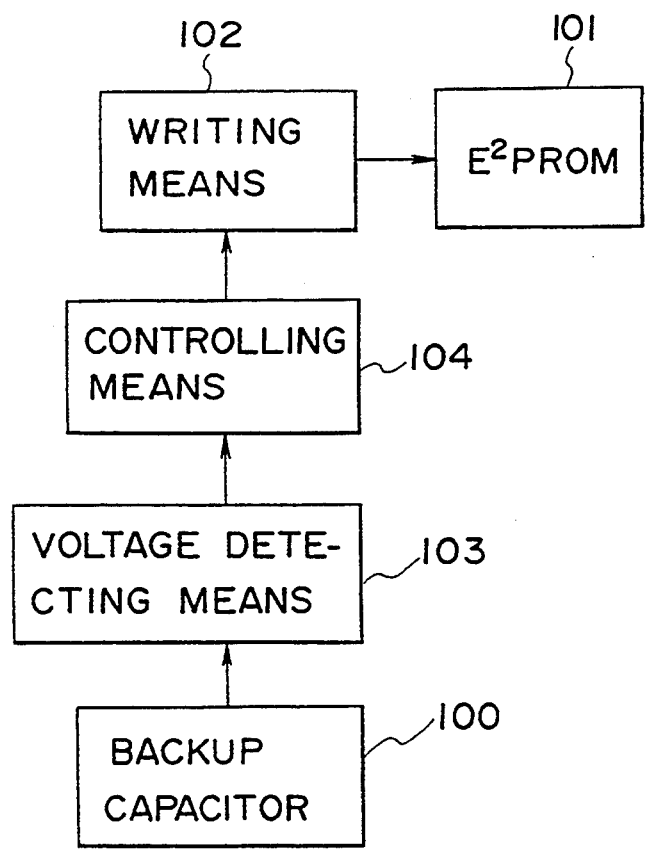
FIG. 10 is a block diagram showing a third fundamental embodiment of a data writing/reading device of a camera according to the present invention.

In the third fundamental embodiment of FIG. 10, a reference numeral 100 is a backup capacitor. The backup capacitor 100 is charged by the battery (not shown in the drawing) of the camera, and backs up the power source in case the battery is removed or exhausted. A reference numeral 101 is an electrically rewritable memory E²PROM. Writing means 102 inputs write requiring data to the E²PROM 101, and writes the data to the E²PROM 101 under a control of controlling means 104. Voltage detecting means 103, prior to the writing of the writing means 102, detects whether a voltage of the backup capacitor 100 is equal to or above a predetermined voltage. The predetermined voltage is set based on a voltage value which is necessary for finishing a writing of data to the E²PROM 101 normally. The voltage detecting means 103 gives a result of the detection to controlling means 104. The controlling means 104, in case the voltage of the backup capacitor 100 is equal to or above the predetermined voltage, permits the writing means 102 to write data to the E²PROM 101. If the voltage of the backup capacitor 100 is below the predetermined voltage, the controlling means 104 inhibits the writing means 102 to write data to the E²PROM 101. According to a composition like this, as a writing of data to to the E²PROM 101 is performed only when a voltage for finishing a writing of data to the E²PROM 101 correctly is available, it is possible to prevent a writing error to the E²PROM 101 which is derived from a shortage of the writing voltage. The contents of the foregoing third fundamental embodiment will be better understood by means of the second preferred embodiment undermentioned with regard to FIG. 11–FIG. 14.

Figure 11:
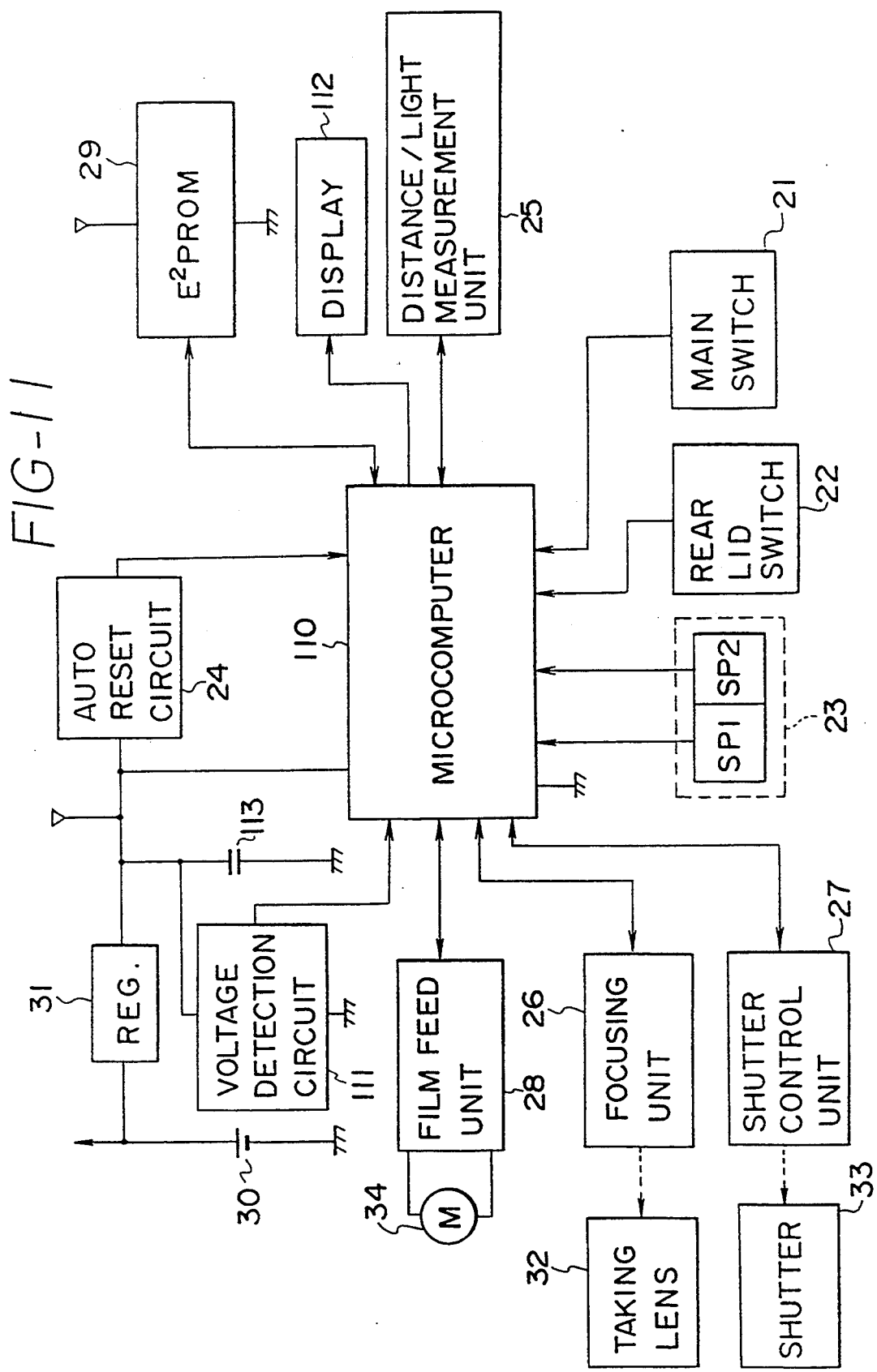
FIG. 11 is a block diagram showing a second preferred embodiment of a data writing/reading device of a camera according to the present invention.

In the second preferred embodiment of FIG. 11, a reference numeral 110 is a microcomputer. The microcomputer 110 receives on/off signals from the main switch 21, on/off signals from the rear lid switch 22, a start signal and a release signal from the release switch 23, a reset signal from the auto reset circuit 24, and voltage detection information from a voltage detection circuit 111. The microcomputer 110 controls the distance/light measurement unit 25, the focusing unit 26, the shutter control unit 27, the film feed unit 28 and a display 112, and writing/reading of the electrically rewritable non-volatile memory E$^2$PROM 29.

The battery 30 supplies power to the focusing unit 26, the shutter control unit 27 and the film feed unit 28, and via the regulator 31 supplies a power source to the microcomputer 110, E$^2$PROM 29 and backup capacitor 113. The backup capacitor 113 is inserted parallelly to the battery 30 between the regulator 31 and the auto reset circuit 24, and is charged by the battery 30 via the regulator 31. The backup capacitor 113, in case the battery 30 is removed or exhausted and the power source is dropped below a normal voltage, backs up the microcomputer 110 and the E$^2$PROM 29 for a short time by supplying the power source to the microcomputer 110 and the E$^2$PROM 29 by discharge.

The voltage detection circuit 111 is inserted parallelly to the backup capacitor 113. The voltage detection circuit 111 gives voltage detection information which indicates whether a voltage of the backup capacitor 113 is equal to or below a predetermined voltage to the microcomputer 110. The predetermined voltage is set based on a voltage which is necessary for finishing a writing of data to the E$^2$PROM 29 normally, and is set to 2.5V or so, for example. The display 112, under a control of the microcomputer 110, displays a remaining number of frames of the film, a necessity of battery change, etc.

The microcomputer 110 has functions for performing automatic focusing, automatic exposure, pre-winding of a film and single frame winding of the film. Further, the microcomputer 110 has a function for writing the number of frames of the film to the E$^2$PROM 29 following FIG. 12–FIG. 14.

Other details of the composition are the same as the details of the composition described in the first preferred embodiment, therefore description is omitted.

Figure 12:
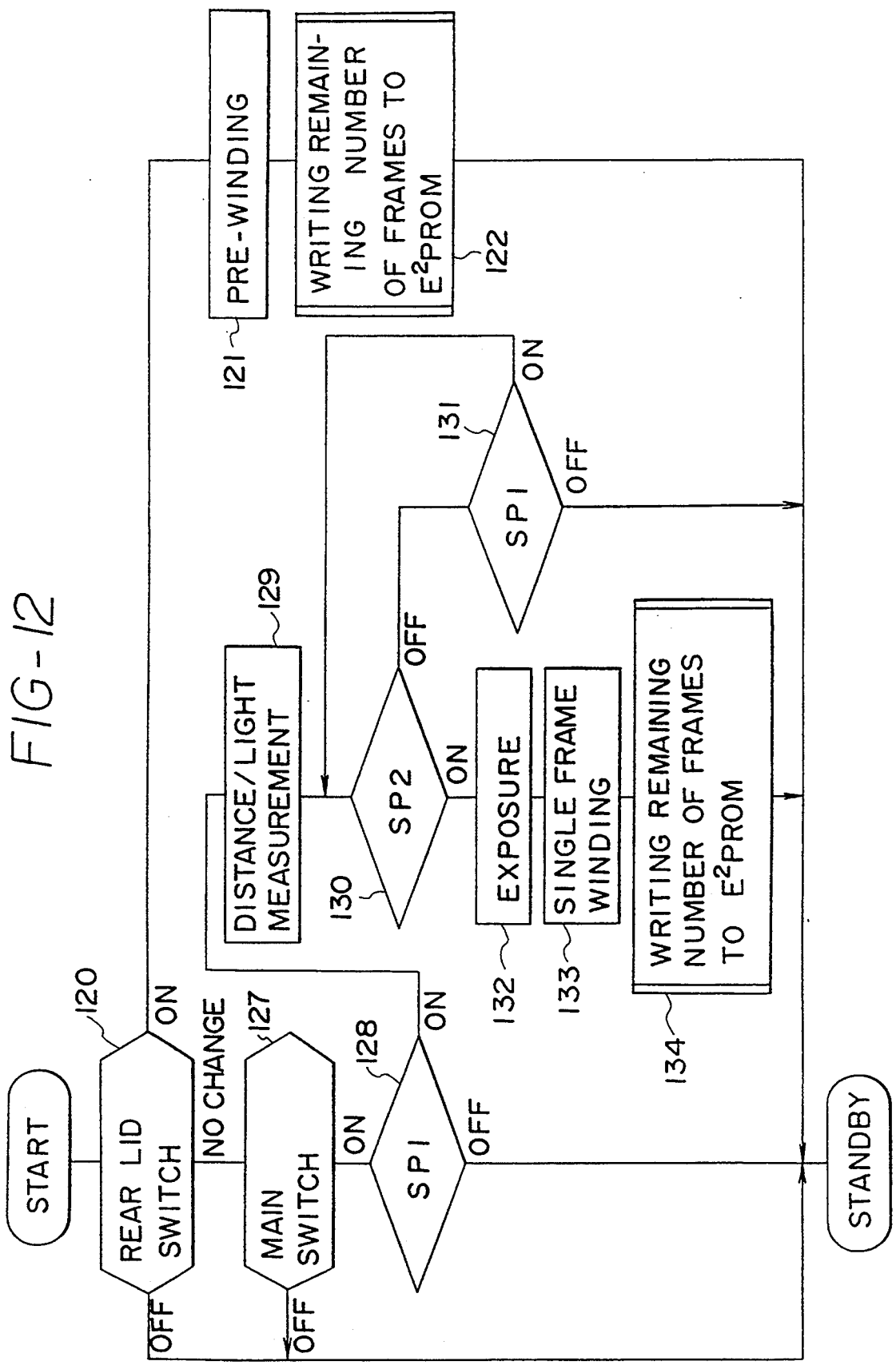
FIG. 12 is a flow diagram of the microcomputer of FIG. 11, showing processings executed by switch operations or when the battery is loaded within a time the power source is backed up.
Figure 13:
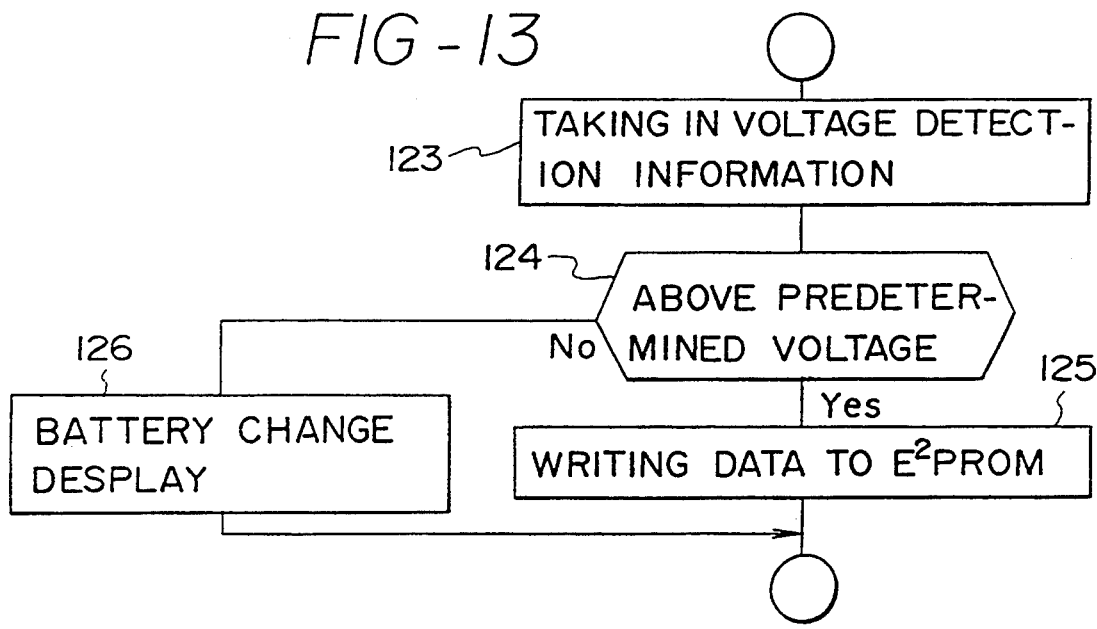
FIG. 13 is a flow diagram of the microcomputer of FIG. 11, showing write processings of steps 122 and 134 of FIG. 12.
Figure 14:
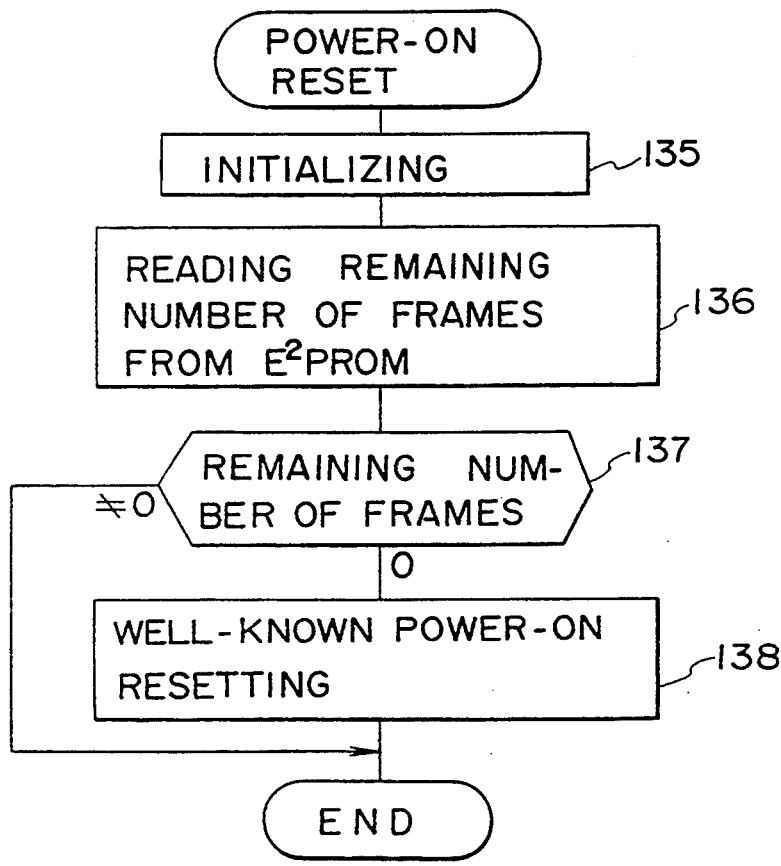
FIG. 14 is a flow diagram of the microcomputer of FIG. 11, showing a processing of power-on reset when the battery is loaded after the time the power source is backed up is passed.

FIG. 12, FIG. 13 and FIG. 14 are flow diagrams of the microcomputer 110 of FIG. 11. FIG. 12 shows processings executed by switch operations or when the battery 30 is loaded within a time the power source is backed up. FIG. 13 shows the write processings of steps 122 and 134 of FIG. 12. FIG. 14 shows a power-on reset processing executed when the battery 30 is loaded after the time the power source is backed up is passed.

When a film, is loaded and the rear lid of the camera is closed, the rear lid switch 22 gives an on signal to the microcomputer 110. By this, the microcomputer 110 starts processings of FIG. 12. The microcomputer 110 enters a step 121 through a status judgment of the rear lid switch 22 at a step 120. At the step 121, the microcomputer 110 pre-winds the film, and writes a remaining number of frames of the film to the E$^2$PROM 29 at the step 122, and goes to a standby status. In the pre-winding, as aforementioned in the first preferred embodiment,, the film in the cartridge is wound up to the spool by a forward rotation of the film feed motor 34. A number of frames wound up to the spool is counted by the microcomputer 110. And, after the film is wound up to the spool completely, the film is unwound by a prescribed length to the cartridge by a reverse rotation of the film feed motor 34, and a first frame is set. The counted remaining number of frames of the film is displayed on the display 112. At the step 122, the remaining number of frames that was counted by pre-winding is written to the E$^2$PROM 29, following the flow diagram of FIG. 13.

In FIG. 13, the microcomputer 110 takes in voltage detection information from the voltage detection circuit 111 at a step 123, and enters a step 124. At the step 124, the microcomputer 110 judges whether a voltage of the backup capacitor 113 is equal to or above the predetermined voltage of the backup capacitor 113. When the voltage of the backup capacitor 113 is equal to or above the predetermined voltage, the microcomputer 110 goes to a step 125, and writes write requiring data to the E$^2$PROM 29, and finishes a writing of the E$^2$PROM 29. In the present embodiment, the write requiring data is the remaining number of frames of the film. If the voltage of the backup capacitor 113 is below the predetermined voltage, the microcomputer 110 enters from the step 124 to a step 126, and finishes a writing to the E$^2$PROM 29, without performing a writing to the E$^2$PROM 29. The predetermined voltage, as aforementioned, is set based on a voltage value which is necessary for finishing normally a writing of data to the E$^2$PROM 29. Because of this, a writing error derived from a shortage of a writing voltage is prevented by inhibiting a writing of data in case the predetermined voltage is not reached.

In FIG. 12, when the main switch 21 is turned on, the microcomputer 110 enters a step 128 through steps 120 and 127. At the step 128, the microcomputer 110 judges on/off of the first-step switch SP1 of the release switch 23. If the first-step switch SP1 is off, the microcomputer 110 goes to a standby status. If the first-step switch SP1 is on, the microcomputer 110 enters a release processing. In the release processing, the microcomputer 110 takes in distance measurement information and light measurement information from the distance/light measurement unit 25 at a step 129, and enters a step 130. At the step 130, the microcomputer 110 judges on/off of the second-step switch SP2 of the release switch 23. If the second-step switch is off, the microcomputer 110 enters the on/off judgment of the first-step switch SP1 of a step 131, and if the second-step switch SP2 is on, enters an exposure processing of a step 132. In the on/off judgment of the first-step switch SP1 of the step 131, the microcomputer 110 returns to the step 130 if the first-step switch SP1 is on, and goes to the standby status if the first-step switch SP1 is off. In the exposure processing of the step 132, the microcomputer 110 delivers the taking lens 32 to a focus position which corresponds to distance measurement information by controlling the focusing unit 26, and opens or closes the shutter 33 according to light information by controlling the focusing unit 27, and returns the taking lens 32 to the home position by controlling the focusing unit 26. The microcomputer 20 enters a step 133 after the exposure processing is finished. At the step 133, the microcomputer 110 performs a single-frame winding of the film by controlling the film feed unit 28, and decrements the remaining number of frames of the film by −1, and displays the current remaining number of frames on the display 112, and enters a step 134. At the step 134, the microcomputer 110 writes the current remaining number of frames to the E$^2$PROM 29 following the flow diagram of FIG. 13, and goes to the standby status after the writing is finished.

If the battery 30 is loaded after a time the power source is backed up by the backup capacitor 113 is passed, the auto reset circuit 24 gives a reset signal to the microcomputer 110. By this, the microcomputer 110 starts a power-on reset of FIG. 14. In the power-on reset of FIG. 14, the microcomputer 110 performs an initializing at a step 135, and enters a step 136. At the step 136, the microcomputer 110 reads out a remaining number of frames from the E²PROM 29, and enters a step 137. At the step 137, the microcomputer 110 judges whether or not the remaining number of frames is zero. If the remaining number of frames is zero, the microcomputer 110 performs the well-known power-on reset processing at a step 138, including display of power-on reset, film winding for winding the film to the cartridge, etc., and finishes the power-on reset. If the remaining number of frames is not zero, the microcomputer 110 finishes the power-on reset without performing processings of the step 138.

In FIG. 12, when the rear lid of the camera is opened and the rear lid switch 22 is turned off, the microcomputer 110 goes from the step 120 and through the well-known rear lid open processing (not shown in the drawing) to the standby status. When the main switch 21 is turned off, the microcomputer 110 goes from the step 127 and through the well-known main switch off processing (not shown in the drawing) to the standby status.

According to a composition like this, whether or not a voltage of the backup capacitor 113 is equal to or above a predetermined voltage prior to a writing of data to E²PROM 29. The predetermined voltage is set based on a voltage value necessary for finishing normally a writing of data to the E²PROM 29. If the voltage of the backup capacitor 113 is equal to or above the predetermined voltage, a writing of data to the E²PROM 29 is permitted. If the voltage of the backup capacitor 113 is bellow the predetermined voltage, a writing of data to the E²PROM 29 is inhibited. Because of this, a writing of data to the E²PROM 29 is performed only when a voltage necessary for finishing normally the writing of data to the E²PROM 29 is available. Therefore, it is possible to prevent a writing error to the E²PROM 29 which is derived from a shortage of the writing voltage.

The foregoing embodiments were described about a remaining number of frames of a film, as an example, but of course said embodiments are also applicable to writing of other data to the E²PROM 29.

A data writing/reading device of a camera which is different from the foregoing embodiments is disclosed below. This device is disclosed in the Japanese Patent Application No. 3-151013.

The data writing/reading device of a camera has an electrically rewritable non-volatile E²PROM, a data writing device for writing data to the E²PROM, and a data reading device for reading data from the E²PROM. The data writing device has first writing means, second writing means, and erasing means. The first writing means, responsive to a start of writing, write a first write start signal to a predetermined address of the E²PROM. After that, the first writing means write data to a second predetermined address of the E²PROM after the writing of the first write start signal. And, the first writing means finish writing when the data is written to the second predetermined address of the E²PROM. The second writing means, responsive to an end of a writing of the first writing means, write a second write start signal to a third predetermined address of the E²PROM. After that, the second writing means write data to a fourth predetermined address of the E²PROM after the writing of the second write start signal. And, the second writing means finish writing when the data is written to the fourth predetermined address of the E²PROM. The erasing means, responsive to and end of a writing of the second writing means, erases the second write start signal which is written to the third predetermined address. And, the erasing means erase the first write start signal which is written to the first predetermined address after erasing the second write start signal. The data reading device has reading/judging means, and reading means. The reading/writing means, responsive to a start of a reading, read the first and third addresses of the E²PROM on which the first and second write start signal are written. And, the reading/writing means judge an existence/non-existence of the first and second write start signals, respectively. The reading means, responsive to a result of the judgment of the reading/judging means, read data as follows. If both the first and second write start signals do not exist, the reading means read data which is stored on either of the second or fourth predetermined address. If both the first and second write start signals exist, the reading means read data which is stored on the second predetermined address. If only the first write start signal exists, the reading means read data of the fourth predetermined address.

According to a composition like this even if a power source becomes unavailable in the middle of a writing of data to the E²PROM, data which is necessary for continuing the operation of the camera can be obtained from the E²PROM when a battery is loaded. That is, in case both the first and second write start signals are not memorized in the E²PROM, it means that the first and second write start signal are erased by the erasing means during writing. As erasure of the first and second write start signals is performed after writing of data to the second and fourth predetermined addresses, the data are written normally to the second and fourth predetermined addresses. Therefore, in this case, data of either one of the second or the fourth predetermined address is read out. If both the second and fourth write start signal are memorized in the E²PROM, it means that, after the first and second writ start signals were written by the first and second writing means, the power source became unavailable before these signals were erases by the erasing means. Because of this, the data of the second predetermined address, which was written between the writing of the first write start signal and the writing of the second write start signal, is written normally. In this case, therefore, the data of the second predetermined address is read out. If only the first write start signal is memorized in the E²PROM, it means that the power source became unavailable after writing the first write start signal and before writing the second write signal, or the power source became unavailable during or after erasing the second write start signal and before erasing the first write start signal. If the former is the case, there is a fear of a writing error on the second predetermined address, and precedingly written data may be remaining on the fourth predetermined address. If the latter is the case, data are written normally to both of the second and fourth addresses. Therefore, in this case, the data of the fourth predetermined address is read out. Even in the worst case, it is possible to continue the operation of the camera following the precedingly written data.

Effective arts (1)–(4) applied to a camera are disclosed below.

(1) According to an art described below, an exposure compensation based on a T-number can be performed more exactly in an auto exposure camera of an external metering system. This art is disclosed in the Japanese Patent Application No. 3-212662.

In the auto exposure camera of the external metering system which performs an exposure compensation based on a T-number, and under a status the camera is completed, a transmissivity of a taking lens of the camera is measured, and an actual T-number value is determined from the measured transmissivity.

The actual T-number value is an actual T-number of a taking lens of a completed camera. From the actual T-number value and a designed T-number value which is stored in a ROM of a microcomputer of the camera, a T-number compensation value for compensating the designed T-number value to the actual T-number value is determined. The designed T-number value is a T-number of the taking lens given on a design stage. The designed T-number value causes an error between the actual T-number value because of a dispersion in assembling of the taking lens and a dispersion in the taking lens itself. The T-number compensation value compensates an error between the designed T-number value and the actual T-number value. A determined T-number compensation value is written to an $E^2PROM$ which is built in the camera. The camera, during an exposure computation, compensates the designed T-number value by the T-number compensation value, and performs an exposure compensation based on the compensated T-number.

(2) According to an art described below, it is possible to perform an adjustment to an error of a distance measurement in an auto focus camera more easily, without performing any mechanical adjustment. This art is disclosed in the Japanese Patent Application No. 3-278755.

When a camera is completed, a pictured object which is located at a predetermined distance is measured by distance measuring means of the camera, and a compensating value for compensating a measurement value by the distance measuring means to the predetermined distance is written to an $E^2PROM$. The distance measuring means cause an error in the distance measurement because of strains by assembling of the distance measurement unit to a camera body. Because of this, an error is caused between the measurement value of the distance measuring means and the actual distance. The compensating value is stored in the $E^2PROM$ when the camera is completed. In a picturing, the camera compensates a measurement value obtained by the distance measuring means by the compensating value, and performs an auto focus control based on a compensated measurement value. In case of a multibeam auto focus camera which has a plurality of beam projecting elements, compensating values to each of measurement values based on each of the beam projecting elements are stored in an $E^2PROM$, and each of the measurement values are compensated by each of the corresponding compensating values.

(3) According to an art described below, it is possible, in an auto focus camera, to perform adjustment to an error in distance measurement, and an alarm is given in case there is a problem in fitting of the distance unit to a camera body. This art is disclosed in the Japanese Patent Application No. 3-278756.

A unit compensation value for compensating an error of a distance measurement unit is written to an $E^2PROM$ precedingly. The unit compensation value is a compensating value for compensating an error of a distance measurement of the distance measurement unit under a unit status of the distance measurement unit, that is, under a status before the distance measurement unit is attached to a camera body. The unit compensation value is determined from a measurement value of the distance measurement unit which is given when the distance measurement unit measures a distance to a pictured object located at a predetermined distance and said predetermined distance. Under a status that a camera is completed with the distance measurement unit is attached to the camera body, a compensating value at the completed status is determined. The compensating value under the completed status is determined from the measurement value which is given when the camera measures the distance to the pictured object which is located at said predetermined distance and said predetermined distance. The unit compensation value is a compensating value of the distance measurement unit itself before it being attached to the camera body, and the compensating value under the completed status is a compensating value of a status after the distance measurement unit is attached to the camera body. Therefore, if there is a big difference between the unit compensation value and the compensating value under the completed status, it can be deemed that a problem may exist in fitting of the distance measurement unit. If the error between the unit compensation value and the compensating value under the completed status is within a predetermined range, the compensation value under the completed status is written to the $E^2PROM$. When the error between the unit compensation value and the compensating value under the completed status is without the predetermined range, it is deemed as a problem exists in fitting of the distance measurement unit, and an alarm is given without performing writing to the $E^2PROM$. In a picturing, the camera compensates a measurement value to each pictured object by the compensating value under the completed status and performs an auto focus control based on a compensated measurement value.

(4) According to an art described below, it is possible to give a short distance alarm for warning of too much an approach to a pictured object in an auto focus camera. Also, according to an art described below, it is possible to set a taking lens accurately at an infinite position. This art is disclosed in the Japanese Patent Application No. 3-278757.

A measurement value obtained by measuring a pictured object which is located at a predetermined short distance from the camera, as a reference value for short distance alarm, to an $E^2PROM$ precedingly. In a picturing, and in case a measurement value of the distance measuring means is less than the reference value for short distance alarm, a short distance alarm for indicating too much an approach to a pictured object is given. The reference value for short distance alarm is a measurement value of distance measuring means of each camera in case an actual distance is a predetermined short distance. Therefore, despite a dispersion of distance measurement of each camera, a short distance alarm is given when the actual distance is less than the predetermined short distance.

A gain of a light receiving circuit in an measurement by the distance measuring means of a pictured object which is located at a predetermined long distance, is written as a long distance gain value to the $E^2PROM$ precedingly. In a picturing, the gain of the light receiving circuit is equal to or more than the long distance gain value when the distance measuring means give a result of distance measurement, the taking lens is set to the infinite position. The long distance gain value is a gain of a light receiving of distance measuring means of each camera when an actual distance is the predetermined long distance. Therefore, despite a dispersion of light volume of the light projecting element or a dispersion on the light receiving circuit, the taking lens is set for an infinite when the actual distance is more than the predetermined distance.

From the foregoing it will now be apparent that a new and improved data writing/reading device of a camera has been found. It should be understood of course that the embodiments disclosed are merely illustrative and are not intended to limit the scope of the invention. Reference should be made to the appended claims, therefore, rather than the specifications as indicating the scope of the invention.

What is claimed is:

1. A data writing/reading device of a camera comprising;
    an electrically rewritable non-volatile memory $E^2$PROM;
    writing/reading means for inputting write requiring data to said $E^2$PROM, writing said write requiring data to a first predetermined address of said $E^2$PROM, and for reading data which is written in said first predetermined address after finishing the writing;
    judging means, responsive to said write requiring data and the data read out by said writing/reading means, for judging coincidence/non-coincidence between said write requiring data and the data read out by said writing/reading means;
    controlling means responsive to judgment results of said judging means, said controlling means, in case said write requiring data and the data read out by said writing/reading means are non-coincident, designating to said writing/reading means another address which is different from the preceding address, and driving said writing/reading means so that said writing/reading means repeats writing and reading until said write requiring data and the data read out from said $E^2$PROM coincide with each other, and said controlling means, in case said write requiring data and the data read out by said writing/reading means are coincident, finishing the writing of said write requiring data to said $E^2$PROM, and giving an address of said $E^2$PROM on which the data which agrees with said write requiring data is written;
    address writing means for receiving the address of said $E^2$PROM on which the data which agrees with said write requiring data is written, said address writing means writing an address of said $E^2$PROM on which the data which agrees with said write requiring data is written, as data, to a second predetermined address of said $E^2$PROM which does not overlap with addresses used for writing said write requiring data; and
    reading means, responsive to a read request, for reading the address of said $E^2$PROM on which the data which agrees with said write requiring data is written from said second predetermined address, and reading the data which agrees with said write requiring data from said $E^2$PROM based on the read address.

2. The device of claim 1, wherein the write requiring data to said $E^2$PROM is a regaining number of frames of a film.

3. The device of claim 1 further comprising;
    a backup capacitor for backing up a power source for a short time in case a battery of said camera is removed or exhausted;
    voltage detecting means for detecting whether a voltage of said backup capacitor is equal to or above a predetermined voltage;
    means, responsive to said voltage detecting means, for permitting writing to said $E^2$PROM in case the voltage of said backup capacitor is equal to or above said predetermined voltage, and for inhibiting writing to said $E^2$PROM in case the voltage of said backup capacitor is below said predetermined voltage; and
    said writing/reading means conducting writing when writing to said $E^2$PROM is permitted and not conducting writing when writing to said $E^2$PROM is inhibited.

4. The device of claim 3, wherein said predetermined voltage is set based on a voltage value necessary for finishing normally a writing of data to said $E^2$PROM.

5. A data writing/reading device of a camera comprising;
    an electrically rewritable non-volatile memory $E^2$PROM;
    writing/reading means for inputting write requiring data to said $E^2$PROM, writing said write requiring data to a predetermined address of said $E^2$PROM, and for reading data which is written in said predetermined address after finishing the writing;
    judging means, responsive to said write requiring data and data read out by said writing/reading means, for judging coincidence/non-coincidence between said write requiring data and data read out by said writing/reading means;
    controlling means responsive to judgment results of said judging means, said controlling means, in case said write requiring data and the data read out by said writing/reading means are non-coincident, designating to said writing/reading means different addresses which follow said predetermined address in order, and driving said writing/reading means so that said writing/reading means repeats writing and reading until said write requiring data and the data read out from said $E^2$PROM coincide with each other, and said controlling means, in case said write requiring data and the data read out by said writing/reading means are coincident, finishing the writing of said write requiring data to said $E^2$PROM; and
    reading means, responsive to a read request, for reading data of addresses which follow said predetermined address in order, and for reading, when an address on which no data is written is reached, the data which agree with said write requiring data from said $E^2$PROM based on an address which is one before the address on which no data is written.

6. The device of claim 5, wherein the write requiring data to said $E^2$PROM is a remaining number of frames of a film.

7. The device of claim 5 further comprising;
    a backup capacitor for backing up the power source for a short time in case the battery of said camera is removed or exhausted;

voltage detecting means for detecting whether a voltage of said backup capacitor is equal to or above a predetermined voltage;

means, responsive to said voltage detecting means, for permitting writing to said E²PROM in case the voltage of said backup capacitor is equal to or above said predetermined voltage, and for inhibiting writing to said E²PROM in case the voltage of said backup capacitor is below said predetermined voltage; and said writing/reading means conducting writing when writing to said E²PROM is permitted and not conducting writing when writing to said E²PROM is inhibited.

8. The device of claim 7, wherein said predetermined voltage is set based on a voltage value necessary for finishing normally a writing of data to said E²PROM.

* * * * *